United States Patent
Nomoto et al.

(10) Patent No.: US 10,950,462 B2
(45) Date of Patent: Mar. 16, 2021

(54) DIAMOND SUBSTRATE PRODUCING METHOD

(71) Applicant: DISCO CORPORATION, Tokyo (JP)

(72) Inventors: Asahi Nomoto, Tokyo (JP); Kazuya Hirata, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/583,776

(22) Filed: Sep. 26, 2019

(65) Prior Publication Data
US 2020/0105543 A1 Apr. 2, 2020

(30) Foreign Application Priority Data

Sep. 28, 2018 (JP) .............................. JP2018-183661

(51) Int. Cl.
*H01L 21/02* (2006.01)
*H01L 21/428* (2006.01)

(52) U.S. Cl.
CPC ...... *H01L 21/428* (2013.01); *H01L 21/02376* (2013.01); *H01L 21/02433* (2013.01)

(58) Field of Classification Search
CPC .............................. B23K 26/53; H01L 29/1602
See application file for complete search history.

(56) References Cited

U.S. PATENT DOCUMENTS

| | | | | |
|---|---|---|---|---|
| 4,442,178 A * | 4/1984 | Kimura | ................ | B28D 5/0011 117/902 |
| 9,868,177 B2 * | 1/2018 | Hirata | ................ | H01L 29/1608 |
| 2007/0069255 A1 * | 3/2007 | Kim, II | ................ | H01L 29/045 257/288 |
| 2014/0038392 A1 * | 2/2014 | Yonehara | ............... | B81C 1/0038 438/463 |
| 2014/0206178 A1 * | 7/2014 | Shreter | ............... | H01L 21/0254 438/478 |
| 2016/0074960 A1 * | 3/2016 | Hirata | ............... | H01L 21/02008 225/2 |
| 2018/0056440 A1 * | 3/2018 | Yamamoto | ......... | B23K 26/0622 |

(Continued)

FOREIGN PATENT DOCUMENTS

JP 2008078611 A 4/2008
JP 2015057824 A 3/2015

*Primary Examiner* — Bradley Smith
*Assistant Examiner* — David J Goodwin
(74) *Attorney, Agent, or Firm* — Greer Burns & Grain, Ltd.

(57) ABSTRACT

A diamond substrate producing method includes a belt-shaped separation layer forming step of applying a laser beam to a diamond ingot as relatively moving the ingot and a focal point of the laser beam in a [110]-direction perpendicular to a (110)-plane, thereby forming a belt-shaped separation layer extending in the [110]-direction inside the ingot, an indexing step of relatively moving the ingot and the focal point in an indexing direction parallel to a (001)-plane and perpendicular to the [110]-direction, a planar separation layer forming step of repeating the belt-shaped separation layer forming step and the indexing step to thereby form a planar separation layer parallel to the (001)-plane inside the ingot, the planar separation layer being composed of a plurality of belt-shaped separation layers arranged side by side in the indexing direction, and a separating step of separating a substrate from the diamond ingot along the planar separation layer.

2 Claims, 3 Drawing Sheets

(56) References Cited

U.S. PATENT DOCUMENTS

| | | | |
|---|---|---|---|
| 2018/0126484 A1* | 5/2018 | Richter | B28D 5/0011 |
| 2019/0061060 A1* | 2/2019 | Kamiyama | B23K 26/0652 |
| 2020/0051831 A1* | 2/2020 | Beyer | H01L 21/3221 |
| 2020/0243337 A1* | 7/2020 | Seddon | B24B 37/20 |

* cited by examiner

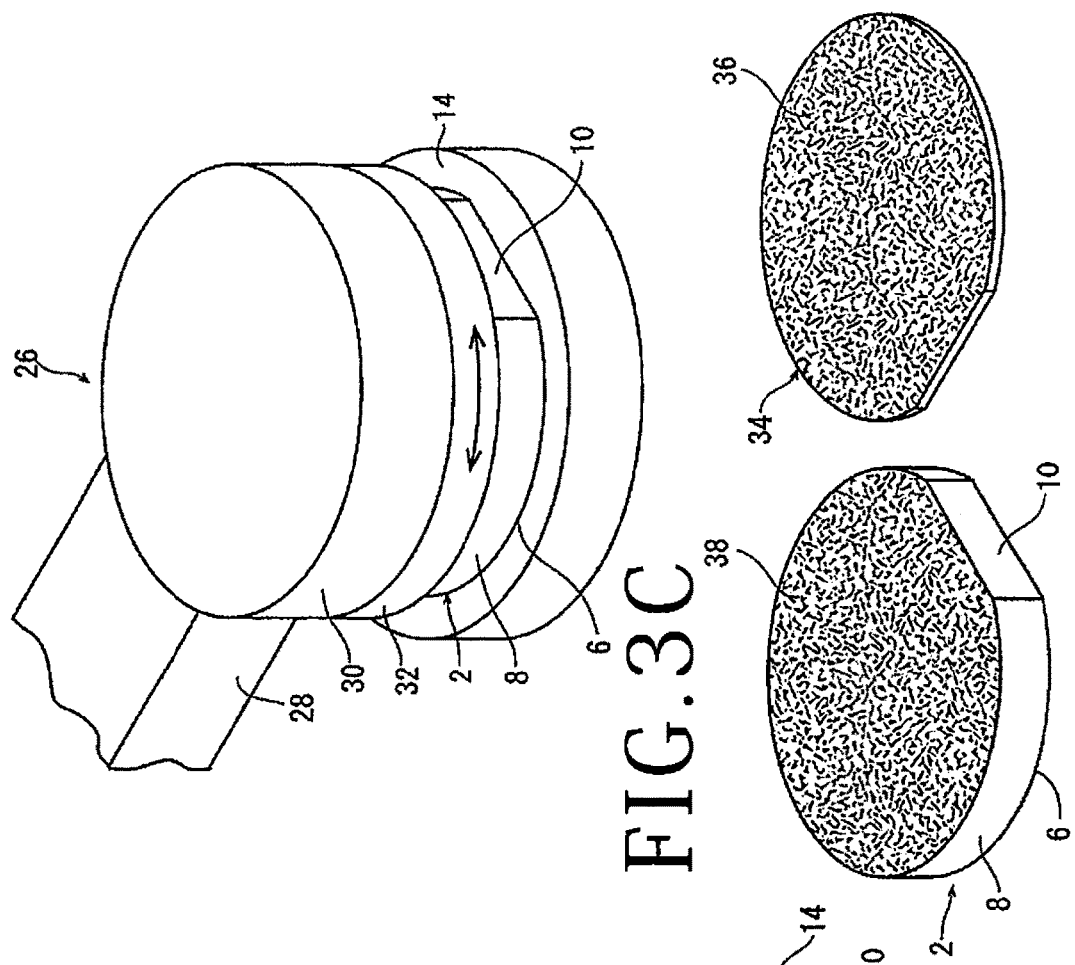

US 10,950,462 B2

DIAMOND SUBSTRATE PRODUCING METHOD

BACKGROUND OF THE INVENTION

Field of the Invention

The present invention relates to a diamond substrate producing method for producing a diamond substrate from a diamond ingot having a flat surface formed on a (001)-plane as a crystal plane.

Description of the Related Art

A plurality of devices such as integrated circuits (ICs) and large-scale integrated circuits (LSIs) are formed by forming a functional layer on the upper surface of a wafer-shaped semiconductor substrate formed of silicon (Si), for example, and partitioning the functional layer into a plurality of separate regions along a plurality of crossing division lines. The semiconductor wafer having the plural devices is divided along the division lines by using a dicing apparatus or a laser processing apparatus to obtain individual device chips respectively corresponding to the plural devices. The device chips thus obtained are used in electrical equipment such as mobile phones and personal computers.

In recent years, attention has been focused on the use of diamond as the material of a semiconductor substrate because diamond is superior in dielectric voltage, thermal conductivity, and physical properties (see Japanese Patent Laid-open No. 2008-78611 and Japanese Patent Laid-open No. 2015-57824, for example).

SUMMARY OF THE INVENTION

However, a technique for efficiently producing a diamond substrate from a diamond ingot is yet under development, and the diamond substrate is expensive and uneconomical.

It is therefore an object of the present invention to provide a diamond substrate producing method which can produce a diamond substrate from a diamond ingot efficiently at low cost.

In accordance with an aspect of the present invention, there is provided a diamond substrate producing method for producing a diamond substrate from a diamond ingot having a flat surface formed on a (001)-plane as a crystal plane, the diamond substrate producing method including: a focal point setting step of setting a focal point of a laser beam having a transmission wavelength to diamond inside the diamond ingot at a predetermined depth from the flat surface of the diamond ingot, the predetermined depth corresponding to a thickness of the diamond substrate to be produced; a belt-shaped separation layer forming step of applying the laser beam to the diamond ingot as relatively moving the diamond ingot and the focal point in a [110]-direction perpendicular to a (110)-plane as another crystal plane, after performing the focal point setting step, thereby forming a belt-shaped separation layer extending in the [110]-direction inside the diamond ingot at the predetermined depth; an indexing step of relatively moving the diamond ingot and the focal point in an indexing direction parallel to the (001)-plane and perpendicular to the [110]-direction, after performing the belt-shaped separation layer forming step; a planar separation layer forming step of repeating the belt-shaped separation layer forming step and the indexing step to thereby form a planar separation layer parallel to the (001)-plane inside the diamond ingot, the planar separation layer being composed of a plurality of belt-shaped separation layers arranged side by side in the indexing direction; and a separating step of separating the diamond substrate from the diamond ingot along the planar separation layer after performing the planar separation layer forming step.

Preferably, the indexing step includes the step of relatively moving the diamond ingot and the focal point in the indexing direction by an index amount preset so that any adjacent ones of the plurality of belt-shaped separation layers come into contact with each other.

According to the diamond substrate producing method of the present invention, the diamond substrate can be produced from the diamond ingot efficiently at low cost.

The above and other objects, features, and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 3A is a perspective view depicting a condition where the diamond ingot is positioned below a separating apparatus;
FIG. 3B is a perspective view depicting a separating step using the separating apparatus depicted in FIG. 3A;
and
FIG. 3C is a perspective view depicting a diamond substrate separated from the diamond ingot and also depicting a remaining diamond ingot obtained by the separating step.

DETAILED DESCRIPTION OF THE PREFERRED EMBODIMENT

Figure 1:
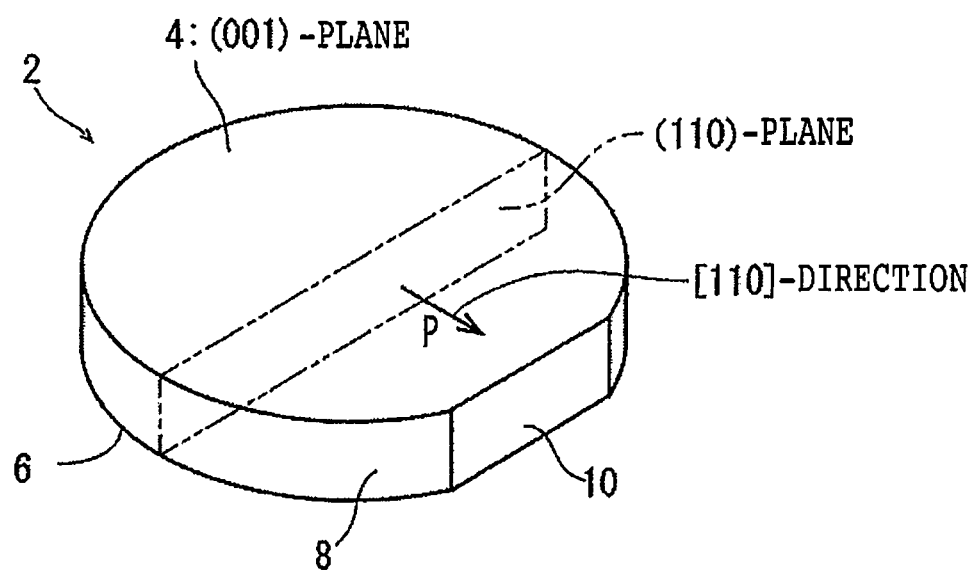
FIG. 1 is a perspective view of a diamond ingot.

A preferred embodiment of the diamond substrate producing method according to the present invention will now be described with reference to the drawings. FIG. 1 depicts a diamond ingot 2 to which the diamond substrate producing method according to the present invention is applicable. As depicted in FIG. 1, the diamond ingot 2 has a substantially cylindrical shape. That is, the diamond ingot 2 has a substantially circular first end surface 4 as a flat surface formed on a (001)-plane as a crystal plane, a substantially circular second end surface 6 opposite to the first end surface 4, and a substantially cylindrical surface 8 formed so as to connect the first end surface 4 and the second end surface 6. The cylindrical surface 8 of the diamond ingot 2 is formed with an orientation flat 10 having a rectangular shape as viewed in side elevation. The orientation flat 10 is parallel to a (110)-plane as another crystal plane. In FIG. 1, an arrow P denotes a [110]-direction perpendicular to the (110)-plane.

In the preferred embodiment, a focal point setting step is first performed to set the focal point of a laser beam having a transmission wavelength to diamond inside the diamond ingot 2 at a predetermined depth from the flat surface (i.e., the first end surface 4 in the preferred embodiment) of the diamond ingot 2, the predetermined depth corresponding to the thickness of a diamond substrate to be produced. The focal point setting step may be performed by using a laser processing apparatus 12, a part of which is depicted in FIG. 2A.

Figure 2A:
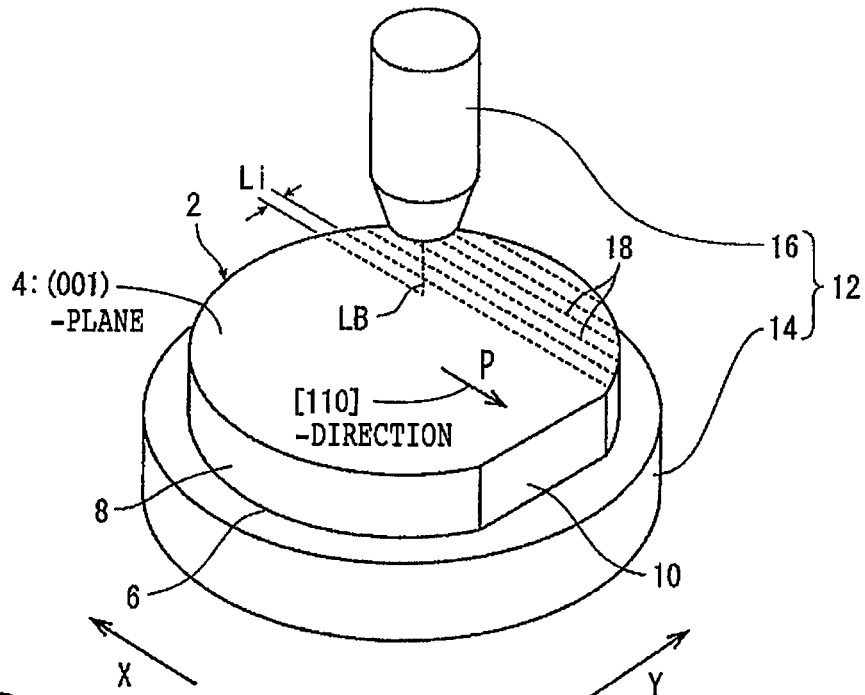
FIG. 2A is a perspective view depicting a belt-shaped separation layer forming step.

As depicted in FIG. 2A, the laser processing apparatus 12 includes a holding table 14 for holding the diamond ingot 2 and focusing means or a condenser 16 applying a pulsed laser beam LB to the diamond ingot 2 held on the holding table 14, the pulsed laser beam LB having a transmission wavelength to diamond. The holding table 14 is rotatable about its vertical axis. The holding table 14 is also movable back and forth both in the X direction depicted by an arrow X in FIG. 2A and in the Y direction depicted by an arrow Y in FIG. 2A, in which the Y direction is perpendicular to the X direction in an XY plane. The XY plane defined by the X direction and the Y direction is a substantially horizontal plane. The holding table 14 is movable from a processing area in the laser processing apparatus 12 to a separating apparatus 26 (see FIG. 3A) which will be hereinafter described.

Figure 2B:
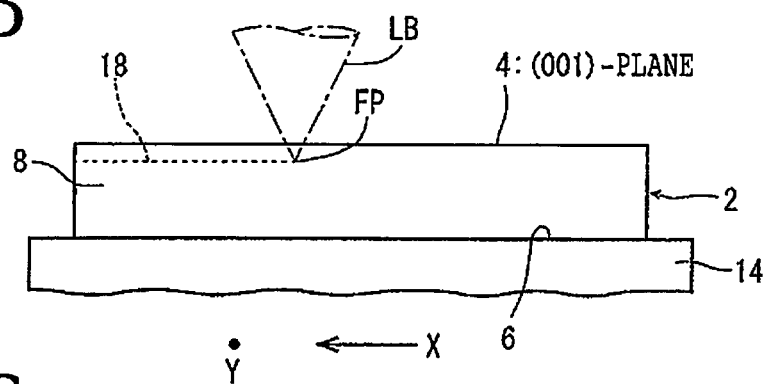
FIG. 2B is an elevational view depicting the belt-shaped separation layer forming step depicted in FIG. 2A.

In performing the focal point setting step, the diamond ingot 2 is first fixed to the upper surface of the holding table 14 by using a suitable adhesive (e.g., epoxy resin adhesive) in the condition where the first end surface 4 of the diamond ingot 2 is oriented upward. That is, the adhesive is interposed between the second end surface 6 of the diamond ingot 2 and the upper surface of the holding table 14. As a modification, a plurality of suction holes may be formed on the upper surface of the holding table 14, and a suction force may be applied through the suction holes to the upper surface of the holding table 14, thereby holding the diamond ingot 2 under suction. Thereafter, an imaging unit (not depicted) included in the laser processing apparatus 12 is operated to image the upper surface of the diamond ingot 2 held on the holding table 14. According to an image of the diamond ingot 2 as detected by the imaging unit, the holding table 14 is rotated and moved to adjust the orientation of the diamond ingot 2 to a predetermined orientation and also adjust the position of the diamond ingot 2 on the XY plane relative to the focusing means 16. In adjusting the orientation of the diamond ingot 2 to the predetermined orientation, the orientation flat 10 is made parallel to the Y direction as depicted in FIG. 2A, so that the [110]-direction perpendicular to the (110)-plane is made parallel to the X direction. Thereafter, focal position adjusting means (not depicted) included in the laser processing apparatus 12 is operated to vertically move the focusing means 16, thereby setting the focal point FP of the pulsed laser beam LB inside the diamond ingot 2 at a predetermined depth (e.g., 200 μm) from the first end surface 4 as a flat surface as depicted in FIG. 2B, the predetermined depth corresponding to the thickness of a diamond substrate to be produced. As described above, the pulsed laser beam LB has a transmission wavelength to diamond.

After performing the focal point setting step, a belt-shaped separation layer forming step is performed to form a belt-shaped separation layer by applying the laser beam LB to the diamond ingot 2 as relatively moving the diamond ingot 2 and the focal point FP in the [110]-direction perpendicular to the (110)-plane.

Figure 2C:
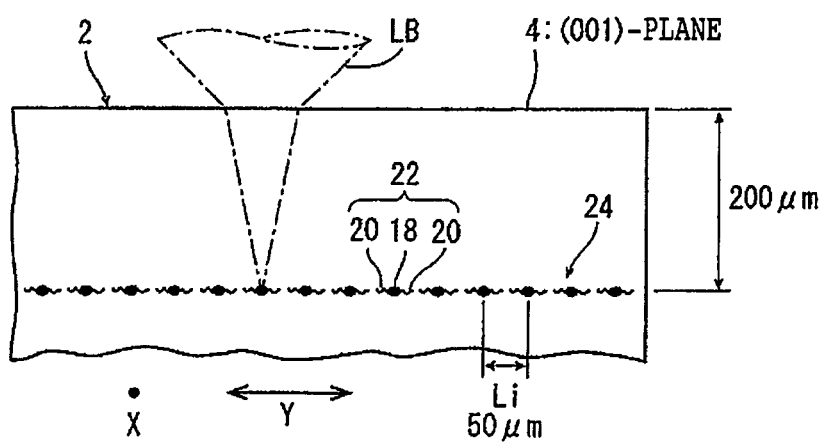
FIG. 2C is a sectional view of the diamond ingot in the condition where a plurality of belt-shaped separation layers are formed to form a planar separation layer inside the diamond ingot.

In performing the belt-shaped separation layer forming step in the preferred embodiment, the holding table 14 holding the diamond ingot 2 is moved at a predetermined feed speed in the X direction parallel to the [110]-direction, which is perpendicular to the (110)-plane. At the same time, the pulsed laser beam LB having a transmission wavelength to diamond is applied from the focusing means 16 to the diamond ingot 2. As a result, as depicted in FIG. 2C, a belt-shaped separation layer 22 is formed inside the diamond ingot 2 at the predetermined depth so as to extend in the X direction, that is, in the [110]-direction, in which the belt-shaped separation layer 22 is composed of a modified portion 18 where the crystal structure is broken by the application of the pulsed laser beam LB and a plurality of cracks 20 isotropically extending from the modified portion 18. While the holding table 14 is moved relative to the focusing means 16 in the X direction in the belt-shaped separation layer forming step as mentioned above, the focusing means 16 may be moved relative to the holding table 14 in the X direction.

After performing the belt-shaped separation layer forming step, an indexing step is performed to relatively move the diamond ingot 2 and the focal point FP in an indexing direction parallel to the (001)-plane and perpendicular to the [110]-direction. In the preferred embodiment, the holding table 14 is moved by a predetermined index amount Li in the Y direction perpendicular to the [110]-direction. As a modification, the focusing means 16 may be moved in the Y direction relative to the holding table 14.

Thereafter, a planar separation layer forming step is performed to form a planar separation layer parallel to the (001)-plane inside the diamond ingot 2 by repeating the belt-shaped separation layer forming step and the indexing step plural times. That is, by repeating the belt-shaped separation layer forming step and the indexing step, a plurality of similar belt-shaped separation layers 22 are formed so as to be arranged side by side in the Y direction, thereby forming a planar separation layer 24 composed of the plural belt-shaped separation layers 22 as depicted in FIG. 2C, in which the planar separation layer 24 formed inside the diamond ingot 2 has a reduced strength. While the cracks 20 of any adjacent ones of the plural belt-shaped separation layers 22 are spaced from each other as depicted in FIG. 2C, the index amount Li in the indexing step is preferably set so that the cracks 20 of the adjacent belt-shaped separation layers 22 come into contact with each other. In this case, the adjacent belt-shaped separation layers 22 can be connected with each other, so that the strength of the planar separation layer 24 can be further reduced. As a result, the separation of a diamond substrate from the diamond ingot 2 in a subsequent separating step can be facilitated.

For example, the planar separation layer forming step may be performed under the following processing conditions, in which the item of "Number of passes" means the number of repetitions of application of the pulsed laser beam LB to the same position in the diamond ingot 2.

Wavelength of the pulsed laser beam: 1064 nm
Average power: 1.0 W
Repetition frequency: 30 kHz
Feed speed: 350 mm/s
Number of passes: 2
Index amount: 50 μm After performing the planar separation layer forming step, a separating step is performed to separate a diamond substrate from the diamond ingot 2 along the planar separation layer 24. The separating step may be performed by using a separating apparatus 26, a part of which is depicted in FIG. 3A. The separating apparatus 26 includes an arm 28 extending in a substantially horizontal direction and a motor 30 connected to the front end of the arm 28. The arm 28 is vertically movable. A disk-shaped suction member 32 is connected to the lower surface of the motor 30 so as to be rotatable about a vertical axis thereof. That is, the suction member 32 is adapted to be rotated about its vertical axis by the motor 30. The suction member 32 has a lower surface as a suction holding surface for holding a workpiece under suction. Further, the suction member 32 contains ultrasonic vibration applying means (not depicted) applying ultrasonic vibration to the lower surface of the suction member 32.

The separating step will now be described in more detail with reference to FIGS. 3A to 3C. In performing the separating step, the holding table 14 holding the diamond ingot 2 is first moved to the position below the suction member 32 of the separating apparatus 26. Thereafter, the arm 28 is lowered to thereby bring the lower surface of the suction member 32 into contact with the first end surface 4 of the diamond ingot 2 (i.e., the upper surface nearer to the planar separation layer 24 formed inside the diamond ingot 2). Accordingly, the first end surface 4 of the diamond ingot 2 is attracted to the lower surface of the suction member 32 under suction. Thereafter, the ultrasonic vibration applying means is operated to apply ultrasonic vibration to the lower surface of the suction member 32. At the same time, the motor 30 is operated to rotate the suction member 32. As a result, a diamond substrate 34 to be produced can be separated from the diamond ingot 2 along the planar separation layer 24 as depicted in FIG. 3C. The diamond substrate 34 has a separation surface 36 having roughness. The separation surface 36 of the diamond substrate 34 is flattened by using a suitable flattening apparatus.

The diamond ingot 2 also has a separation surface 38 having roughness after separating the diamond substrate 34. The separation surface 38 of the diamond ingot 2 is also flattened to obtain a flat surface. Thereafter, the focal point setting step, the belt-shaped separation layer forming step, the indexing step, the planar separation layer forming step, and the separating step may be similarly repeated to thereby produce a plurality of similar diamond substrates 34 from the diamond ingot 2. Accordingly, the diamond substrate 34 can be produced from the diamond ingot 2 efficiently at low cost.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A diamond substrate producing method for producing a diamond substrate from a diamond ingot having a flat surface formed on a (001)-plane as a crystal plane, said diamond substrate producing method comprising:
   a focal point setting step of setting a focal point of a laser beam having a transmission wavelength to diamond inside said diamond ingot at a predetermined depth from said flat surface of said diamond ingot, said predetermined depth corresponding to a thickness of said diamond substrate to be produced;
   a belt-shaped separation layer forming step of applying said laser beam to said diamond ingot as relatively moving said diamond ingot and said focal point in a [110]-direction perpendicular to a (110)-plane as another crystal plane, after performing said focal point setting step, thereby forming a belt-shaped separation layer extending in said [110]-direction inside said diamond ingot at said predetermined depth;
   an indexing step of relatively moving said diamond ingot and said focal point in an indexing direction parallel to said (001)-plane and perpendicular to said [110]-direction, after performing said belt-shaped separation layer forming step;
   a planar separation layer forming step of repeating said belt-shaped separation layer forming step and said indexing step to thereby form a planar separation layer parallel to said (001)-plane inside said diamond ingot, said planar separation layer being composed of a plurality of belt-shaped separation layers arranged side by side in said indexing direction; and
   a separating step of separating said diamond substrate from said diamond ingot along said planar separation layer after performing said planar separation layer forming step.

2. The diamond substrate producing method according to claim 1, wherein said indexing step includes a step of relatively moving said diamond ingot and said focal point in said indexing direction by an index amount preset so that any adjacent ones of said plurality of belt-shaped separation layers come into contact with each other.

* * * * *